United States Patent [19]

Milby et al.

[11] Patent Number: 4,609,829
[45] Date of Patent: Sep. 2, 1986

[54] APPARATUS FOR ASSISTING IN THE CONNECTION AND DISCONNECTION OF A BOARD WITH AN ENERGIZED CIRCUIT

[75] Inventors: Gregory H. Milby, San Diego; Richard A. Daniel, Escondido; Paul M. Rostek, San Diego, all of Calif.

[73] Assignee: NCR Corporation, Dayton, Ohio

[21] Appl. No.: 643,501

[22] Filed: Aug. 23, 1984

[51] Int. Cl.$^4$ .............................................. H02J 7/00
[52] U.S. Cl. ................................. 307/150; 307/149; 307/85; 361/412; 361/415; 361/407; 363/49; 323/901
[58] Field of Search ...................... 307/51, 85, 86, 87, 307/96, 149, 150; 361/407, 415, 412, 399, 395, 394; 323/234, 235, 238, 242, 321, 326, 901; 363/49

[56] References Cited
U.S. PATENT DOCUMENTS

| | | | |
|---|---|---|---|
| 3,368,117 | 2/1968 | Pond et al. | 361/407 X |
| 3,500,174 | 3/1970 | Ellerbeck | 323/321 |
| 3,621,373 | 11/1971 | Mitchell | 323/238 |
| 3,691,399 | 9/1972 | Vinch et al. | 307/149 |
| 3,925,710 | 12/1975 | Ebert | 361/415 |
| 4,145,620 | 3/1979 | Dice | 307/149 |
| 4,158,220 | 6/1979 | Yamamoto et al. | 361/415 |
| 4,204,148 | 5/1980 | Gaertner | 323/238 |
| 4,207,516 | 6/1980 | Babcock | 323/238 |
| 4,217,624 | 8/1980 | Tuck | 361/394 |
| 4,272,805 | 6/1981 | Iguchi et al. | 363/49 X |
| 4,307,440 | 12/1981 | Inoue et al. | 323/901 X |
| 4,311,956 | 1/1982 | Tolmie | 323/326 X |
| 4,328,459 | 5/1982 | McLeod | 323/321 X |
| 4,390,831 | 6/1983 | Byrd et al. | 323/238 X |
| 4,511,950 | 4/1985 | Bunner et al. | 361/415 X |
| 4,514,786 | 4/1985 | Charruau | 361/412 X |
| 4,542,443 | 9/1985 | Rinefierd | 361/415 |

Primary Examiner—William M. Shoop, Jr.
Assistant Examiner—Shik Luen Paul Ip
Attorney, Agent, or Firm—Wilbert Hawk, Jr.; Edward Dugas; Floyd A. Gonzalez

[57] ABSTRACT

An apparatus for assisting in the electrical connection and disconnection of a circuit board with an energized circuit having a power supply, a power connection electrically connected to the power supply and having a board connector for electrical connection to a circuit board to be inserted into or removed from an energized circuit, and a control circuit for controlling the power supply means. The control circuit controls the precharging of a circuit board to a selected voltage level prior to its insertion into a circuit, and maintains a selected voltage level on a circuit board during its removal from an energized circuit.

8 Claims, 3 Drawing Figures

APPARATUS FOR ASSISTING IN THE CONNECTION AND DISCONNECTION OF A BOARD WITH AN ENERGIZED CIRCUIT

BACKGROUND OF THE INVENTION

The present invention relates generally to assisting in the connection and disconnection of a circuit board with an energized circuit, and more particularly to an apparatus for maintaining a selected voltage level on a circuit board during its insertion into or removal from an energized circuit.

The removal of a circuit board such as a daughter card from a back panel with the power on often results in physical or logical damage to the system. Logic errors generally result from the substantial current spikes which are generated as the on board capacitance charges to the bus voltage. Physical and electrical damage to the DIN connector can also result from arcing and material transfer effects as the connection and disconnection with an energized circuit is made.

SUMMARY OF THE INVENTION

In a preferred embodiment of the present invention, an apparatus for assisting in the electrical connection and disconnection of a circuit board with an energized circuit includes a power supply, a power connection electrically connected to the power supply and having a board connector for electrical connection to a circuit board to be inserted into or removed from an energized circuit, and a control circuit for controlling the power supply means. The control circuit controls the precharging of a circuit board to a selected voltage level prior to its insertion into a circuit, and maintains a selected voltage level on a circuit board during its removal from an energized circuit.

The apparatus of the present invention precharges the circuit board to within 0.25 volts of the back panel voltage, thereby reducing the induced noise to acceptable levels. Also, the reducing of the difference in the potentials of the circuit board and the energized circuit to within 0.25 volts of each other allows in excess of 80 insertions of board connectors at a load of 16 amps without causing significant change in the connector's electrical parameters.

It is thus an object of the present invention to provide an apparatus for assisting in the electrical connection and disconnection of a circuit board with an energized circuit.

A further object of the present invention is to provide an apparatus for reducing the premated potential to within 0.25 volts by pre-charging of a circuit board.

A further object of the invention is to provide an apparatus by creating a voltage ramp function for pre-charging a circuit board which ramps the voltage from 0 volts to within 0.25 volts of the back panel in 100 milliseconds.

DESCRIPTION OF THE PREFERRED EMBODIMENT

Figure 1:
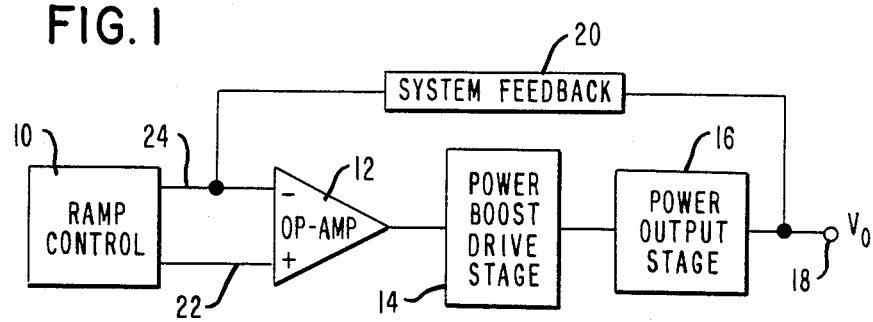
FIG. 1 is a block diagram of the apparatus of the present invention.

FIG. 1 is a block diagram of the apparatus of the present invention and includes a ramp control 10 connected to an operational amplifier 12. The ramp control 10 controls the operational amplifier 12 for ramping its output either upwardly or downwardly. The operational amplifier 12 is connected to a power boost drive stage 14 which boosts the output from the operational amplifier 12 for input into a power output stage 16. The power output stage 16 provides power to an output terminal 18 for connection to a circuit board to be inserted into or removed from an energized circuit, as will be explained. A system feedback circuit 20 is connected between the output of the power output stage 16 and one of the inputs of the operational amplifier 12.

The ramp control 10 has a non-inverting output 22 connected to the positive input of the operational amplifier 12 which is tied to a +5 volt supply (shown in FIG. 2) available in the ramp control 10. The ramp control 10 also has an inverting output 24 connected to the negative input of the operational amplifier 12 and the system feedback 20 as shown in FIG. 1. The ramp control 10 includes a switch (shown in FIG. 2) for switching the inverting output 24 such that the operational amplifier 12 will cause the output voltage of the apparatus to ramp either upwardly or downwardly depending upon the position of the switch.

Figure 2:
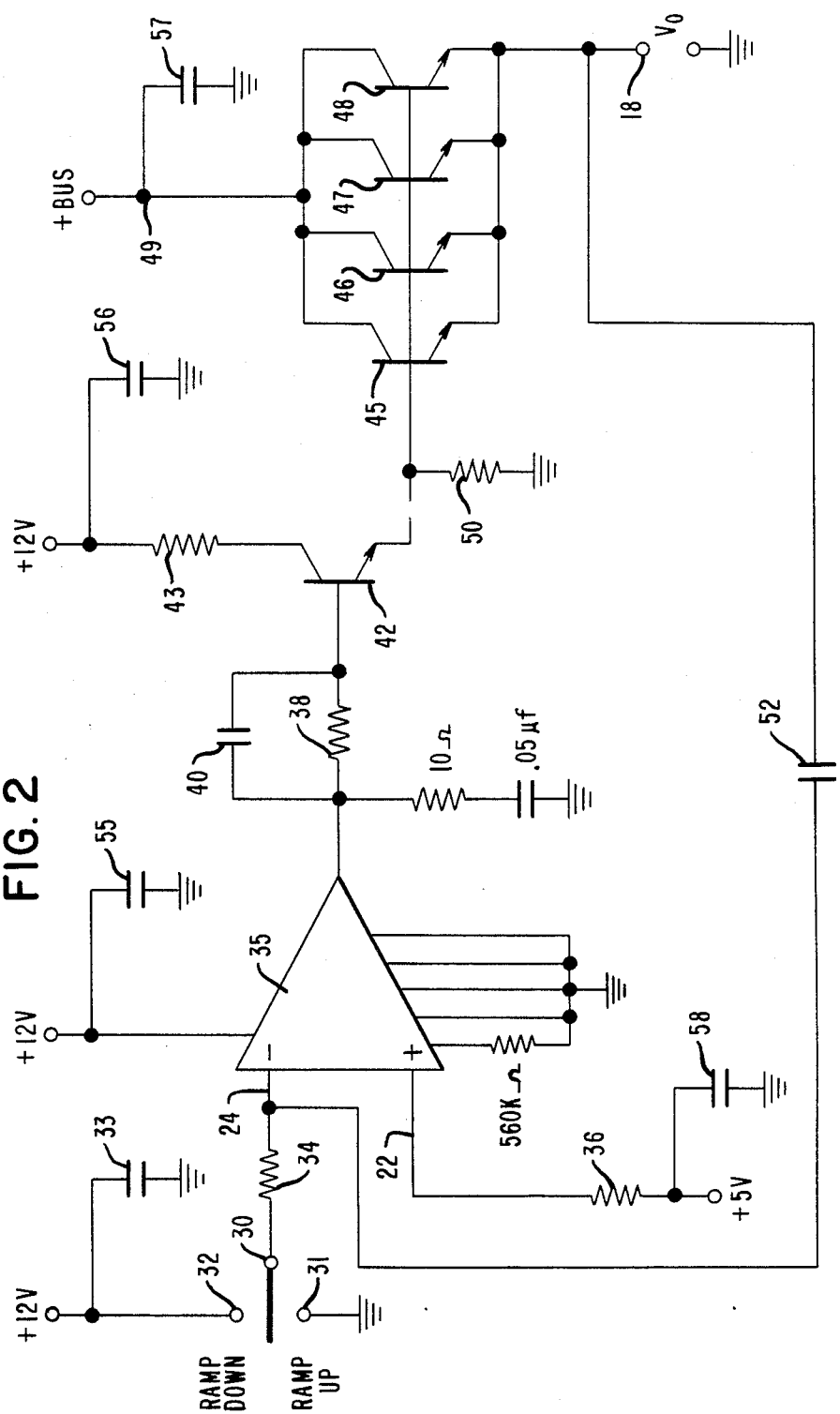
FIG. 2 is a schematic diagram of a circuit for implementing the apparatus of FIG. 1.

FIG. 2 is a schematic diagram of the apparatus of FIG. 1 and includes a toggle switch 30 having a ramp up position 31 wherein the toggle switch is closed in a grounded condition, and a ramp down position 32 wherein the toggle switch 30 is closed to a +12 volt power supply. A 0.1 microfarad capacitor 33 is provided as a decoupling capacitor. The toggle switch 30 is connected to one end of a 100K ohm input resistor 34 whose other end is connected to the negative input of an operational amplifier 35. The operational amplifier 35, which is shown as operational amplifier 12 in FIG. 1, is an LM1380P operational amplifier available from National Semiconductor of Santa Clara, Calif. which can supply in excess of 120 milliamps to the following power boost drive stage 14. As previously mentioned, a 5 volt voltage supply is connected through a 100K ohm input resistor 36 to the positive side of operational amplifier 35. The output of operational amplifier 35 is connected to a parallel circuit made up of a 62 ohm base drive resistor 38 and a 0.1 microfarad bypass capacitor 40, with the other side of this parallel circuit connected to the base of a drive transistor 42. The collector of the drive transistor 42 is connected through a 6.3 ohm collector resistor 43 to the +12 volt voltage supply. The drive transistor 42 is a TIP41,7A transistor available from RCA of Camden, N.J., has a minimum $h_{FE}$ of 15, and supplies approximately 1 amp to the power output stage 16. The drive current is limited by the collector resistor 43 and the base resistor 38 which limits the operational amplifier drive.

The power output stage 16 of FIG. 1 includes four 25 amp bipolar output transistors 45, 46, 47, and 48 for supplying current at a bulk beta factor of approximately 16. The output transistors 45-48 are 2N5885 transistors available from RCA, and were chosen to meet the criteria of $V_{CE}$ saturation voltage at high $I_C$ collector currents. The bypass capacitor 40 prevents output spikes which occur when the output transistors 45-48 are driven into saturation. A charge storage drain off resistor 50 of 470 ohms is provided for draining off charge storage at the base of the output transistors 45-48. A 1 microfarad ramp capacitor 52 is provided in the system feedback 20 of FIG. 1 and is connected as shown in FIG. 2 between the output terminal 18 and the negative input of the operational amplifier 35.

The system feedback accomplished through the ramp capacitor 52 provides a ramp function. The operational amplifier provides current through the power boost drive stage 14 and the power output stage 16 to the ramp capacitor 52 in the system feedback circuit 20 to provide a voltage ramp. The RC time constant of the voltage ramp is the value of the input resistor 34 times the ramp capacitor 52. In the disclosed embodiment, the output voltage $V_0$ ramps from zero to 0.25 volts below the voltage on the bus terminal 49 in 100 milliseconds.

Capacitors 33, 55, 56, 57 and 58 are all decoupling 0.1 microfarad capacitors, and are connected as shown in FIG. 2. The +12 volts and +5 volt voltage supplies and ground are supplied from the host system back panel into which a circuit board is to be inserted or removed while the host system remains energized.

The positive bus voltage from the positive bus of the back panel of the host system is connected to bus terminal 49, which is in turn connected to the collectors of the power output transistors 45-48.

Figure 3:
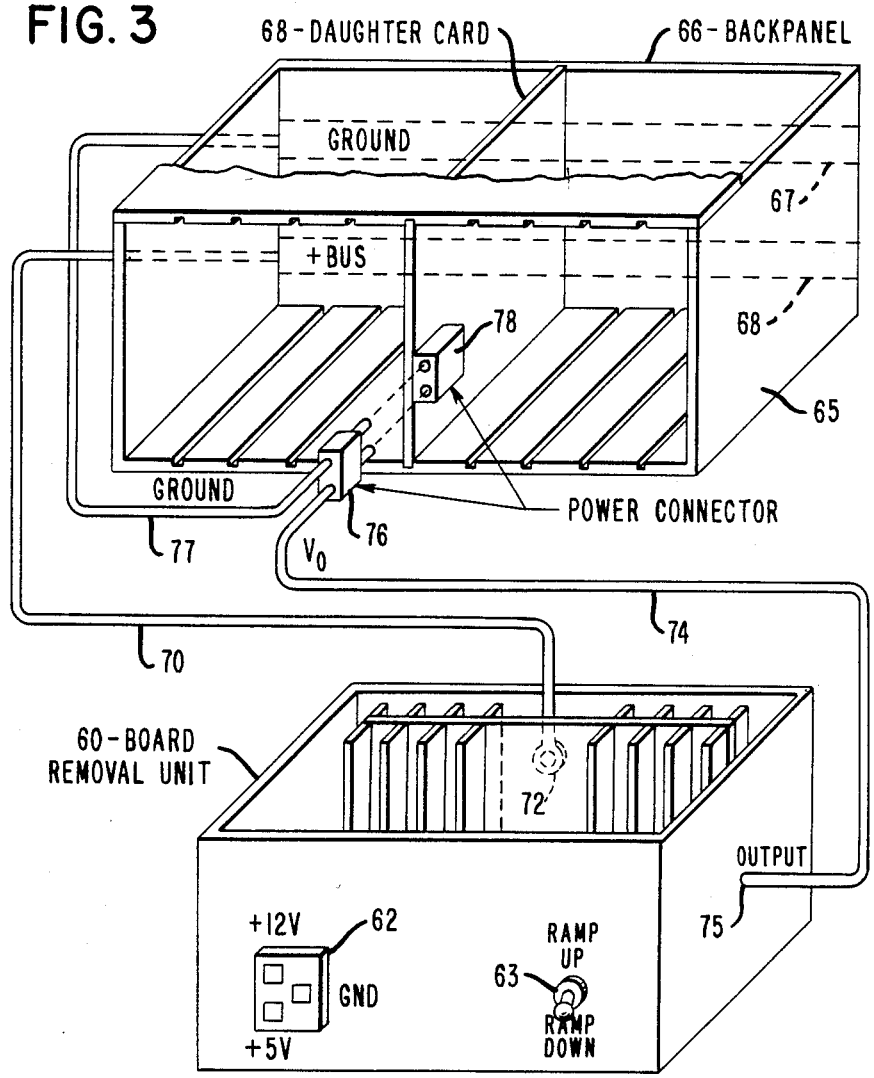
FIG. 3 is a diagrammatic illustration of the apparatus of FIG. 1 showing its connection to a daughter card and a back panel prior to the removal of the daughter card from an energized back panel.

FIG. 3 is a diagrammatic illustration of the apparatus of the invention in use for assisting in the electrical connection and disconnection of a circuit board with an energized circuit. A device 60, referred to hereinafter as a board removal unit, incorporating the circuit of FIG. 2, has a universal 3-prong receptacle 62 for receiving a +12 volt supply, +5 volt supply and ground. Use of a universal 3-prong connector supplies the voltages and ground of the circuit of FIG. 2. A toggle switch 63, corresponding to the switch 30 of FIG. 2, is located on the front panel of the board removal unit 60 and has a first position for ramp up and a second position for ramp down. A host system 65 includes a back panel 66 having a ground bus 67 and a positive voltage bus 68. The host system 65 also includes a daughter card 68 which is to be either connected into the back panel 66 or disconnected from the back panel 66 while the host system remains energized.

A conductor 70 is connected between the positive voltage bus 68 of the back panel 66 and a bus input terminal 72 on the board removal unit 60. This bus input terminal 72 corresponds to the bus input terminal 49 of the circuit of FIG. 2. An output conductor 74 is connected between an output terminal 75 of the board removal unit 60 and a 2-prong power connector 76. A ground conductor 77 is connected between the ground bus 67 of the back panel 66 and the 2-prong power conductor 76. The 2-prong power connector 76 is inserted into the 2-prong power connector receptacle 78 to connect the output of the board removal unit 60 and the ground of the ground bus 67 into the daughter card 68.

It will be understood that the $V_0$ side of the power connector receptacle 78 is connected to the positive voltage bus (not shown) of the daughter card 68. The positive voltage bus of the daughter card 68 is connected through a conventional connector, such as an edge connector, to the positive voltage bus 68 of the host system 65. Similarly, it will be understood that the ground side of the power connector receptacle 78 is connected to the ground bus (not shown) of the daughter card 68. The ground bus of the daughter card 68 is connected through a conventional connector, such as an edge connector, to the ground bus 67 of the host system 65.

If the daughter card 68 is to be removed, the toggle switch 63 is placed in the ramp down position, and the 2-prong connector 76 is mated with the receptacle 78 on the daughter card to be removed. The toggle switch 63 is then placed in the ramp up position, and the output voltage of the board removal unit 60 is ramped up by the operation of the operational amplifier 35, the ramp capacitor 52, the voltage on the bus terminal 49, and the output transistors 45-48 as explained in connection with FIG. 2. The daughter card can now be removed. Since in the disclosed circuit, the voltage on the daughter card 68 will remain within 0.25 volts of the voltage on the positive voltage bus 68 of the back panel 62 through the connection of plug 76 with receptacle 78 during the removal process, there will be no logic errors caused by induced noise, and there will be no arcing or material transfer effects which cause physical or electrical damage to the electrical connectors between the daughter card 68 and the back panel 66. After the daughter card 68 has been removed, the toggle switch 63 is placed in the ramp down position, and after the voltage has been ramped down to 0, the 2-prong plug 76 may be unplugged from the receptacle 78.

When the daughter card 68 is to be inserted into the back panel 66 while the host system 65 remains energized, the toggle switch 63 is placed in the ramp down position. The power connector 2-prong plug 76 is inserted into the receptacle 78. The toggle switch 63 is then placed in the ramp up position, and the voltage is ramped up to within about 0.25 volts of the voltage on the positive voltage bus 68. The daughter card 68 is then inserted into the back panel, without logic errors or physical or electrical damage being caused by the insertion. The power connector plug 76 is then withdrawn from the receptacle 78, and the toggle switch 63 is placed in the ramp down position to return the voltage on the output of the board removal unit 60 to 0 volts.

One advantage of this invention is that the host system can be operating while repairs are being performed. For example, since the power does not have to be turned off to prevent physical damage to a circuit board or to prevent logic errors, the board removal unit including the circuit described allows any circuit board to be taken out and replaced with a new board with full power applied to the host system.

An apparatus for assisting in the electrical connection and disconnection of a circuit board with an energized circuit has been described which prevents logic errors in a host system and physical or electrical damage to the circuit board and its connectors during the connection and disconnection process. It will be understood that the apparatus described, and its components, are exemplary only, and may be replaced by equivalents by those skilled in the art, which equivalents are intended to be covered by the attached claims.

What is claimed is:

1. In a system having an energizable circuit comprised of a plurality of circuit boards and a system DC power supply for energizing the circuit including each of the circuit boards, an apparatus for assisting in the electrical connection and disconnection of a selected one of the circuit boards with the circuit of the system energized, said apparatus comprising:

second DC power supply means for energizing said selected circuit board only during its connection and disconnection;

power connection means electrically connected to said second DC power supply means and having a board connector for electrical connection to the selected circuit board to be inserted into or removed from the energized circuit; and control means for controlling said second DC power supply means, said control means controlling the precharging of said selected circuit board to a selected voltage level prior to its insertion into the circuit, and the maintaining of a selected voltage level on said selected circuit board during its removal from the energized circuit.

2. The apparatus of claim 1 wherein said control means comprises switch means having a ramp-up position for controlling the ramping up of the voltage output of said board connector from zero volts to said selected voltage level, and a ramp-down position for controlling the ramping down of the voltage output of said board connector from said selected voltage level to zero volts.

3. The apparatus of claim 2 wherein said control means further comprises an operational amplifier having a negative input connected to the output of said switch means, a positive input connected to a voltage source, and an output connected to said second DC power supply means.

4. The apparatus of claim 3 wherein said control means further comprises an input resistor connected between the output of said switch means and the negative input of said operational amplifier;

a positive bus input for connection to the system DC power supply; and a ramp capacitor connected between said positive bus input and the negative input of said operational amplifier, said input resistor and said ramp capacitor being sized to control the ramping up of the output voltage of said board connector in a selected time.

5. The apparatus of claim 4 further comprising a power boost drive stage between said control means and said second DC power supply means, said power boost drive stage including a bipolar transistor having its base connected to the output of said operational amplifier, its collector connected to a constant voltage source, and its emitter connected to said second DC power supply means.

6. The apparatus of claim 5 wherein said second DC power supply means comprises a plurality of bipolar power supply transistors having their collectors in common and connected to said positive bus input, their emitters in common and connected to said power connection means, and their bases in common and connected to the emitter of said bipolar transistor of said power boost drive stage.

7. The apparatus of claim 1 or 5 wherein said power connection means comprises a quick connector for making a quick, easily made electrical connection with the selected circuit board to be inserted into or removed from the energized circuit.

8. In a system having an energizable circuit comprised of a plurality of circuit boards and a DC energizing source for energizing said circuit, a power supply for a selected one of said boards comprising:

power supply means for separately providing the DC power supply requirements of said selected circuit board including connector means releasably attachable to said selected circuit board for supplying DC power requirements thereto, and feedback means releasably attachable to the DC energizing source for energizing said circuit board, said feedback means providing a feedback parameter which said power supply means matches while providing said DC power requirements during the connection or disconnection of said circuit board with said DC energizing source.

* * * * *